United States Patent [19]

Gershfeld

[11] Patent Number: 4,654,712
[45] Date of Patent: Mar. 31, 1987

[54] HIGH FREQUENCY WIDE BANDWITH VIDEO AMPLIFIER WITH HIGH TRACKING LINEARITY

[76] Inventor: Jack Gershfeld, 10041 Montecito Plz., Garden Grove, Calif. 92640

[21] Appl. No.: 723,903

[22] Filed: Apr. 16, 1985

[51] Int. Cl.$^4$ .............................................. H04N 5/16
[52] U.S. Cl. ...................... 358/184; 358/65; 358/190
[58] Field of Search ................. 358/65, 184, 188, 190; 330/202, 290, 297, 306, 11

[56] References Cited

U.S. PATENT DOCUMENTS

| | | | |
|---|---|---|---|
| 3,383,615 | 5/1968 | Milberger et al. | 330/306 |
| 3,955,047 | 5/1976 | Willis | 330/290 |
| 4,229,706 | 10/1980 | Bongiorno | 330/297 |
| 4,323,923 | 4/1982 | Reneau | 358/184 |
| 4,401,954 | 8/1983 | Suzuki | 330/297 |
| 4,560,946 | 12/1985 | Yokoyama | 330/297 |
| 4,598,255 | 7/1986 | Hong | 330/297 |

Primary Examiner—Tommy P. Chin
Attorney, Agent, or Firm—Robert J. Schaap

[57] ABSTRACT

A wide bandwith video amplifier circuit with a high output DC voltage bias and which is capable of high tracking linearity. The video amplifier circuit comprises an AC pre-amplifier, a DC restorer amplifier stage and a DC output stage. The DC restorer amplifier stage and the output stage operate from a first DC power supply which is floating such that the output stage can be biased at a desired D.C. voltage, relative to a floating ground. A first power supply is used to provide the necessary power to the amplifier circuits, DC restorer amplifier and the output stage. A second power supply provides a DC bias voltage to the output stage and DC restorer stage which is additive to the DC level of the amplifier circuit set within a floating DC power supply. This DC bias voltage can be altered relative to a true 0 volt ground level, thus allowing the setting of the DC bias of the output stage at a required level relative to the true ground potential.

22 Claims, 5 Drawing Figures

HIGH FREQUENCY WIDE BANDWITH VIDEO AMPLIFIER WITH HIGH TRACKING LINEARITY

BACKGROUND OF THE INVENTION

1. Field of the Invention

This invention relates in general to certain new and useful improvements in wide bandwith video amplifier circuits and more particularly, to wide bandwith video amplifiers having high tracking linearity and adjustable DC level of the output signal relative to a true ground potential.

2. Brief Description of the Prior Art

In recent years, there has become an increased need, and an increased demand for high resolution video monitors, projectors and projection systems for purposes of generating computer graphics and alphanumeric displays, and for high resolution in other types of CRT monitors where wide bandwith and/or high tracking linearity is needed.

Generally, most conventional video amplifiers which are used for amplifying video signals have a number of circuit components and stages which provide various functions necessary for proper amplification of a video signal and display thereof. A video signal is normally introduced into an AC coupled pre-amplifier-gain control stage. This AC pre-amplifier is operated generally from a low DC voltage supply.

The amplified video signal is then introduced into a DC restorer and then into an output stage of the conventional video amplifier. The output stage sometimes includes a buffer section. The output stage also typically includes a feedback to a summing node, which is connected to the input of the DC restorer amplifier. When the video signal is passed through a capacitor, either at the AC amplifier stage or thereafter, the DC bias of this signal has been effectively removed. The feedback from the output stage to a summing node at the input of the DC amplifier adds the DC component during a predetermined period of time to the AC signal which had the DC bias stripped therefrom. This action clamps the video signal to a specific DC level, thus allowing proper operation of a cathode ray tube.

For low and mid-frequency amplifiers, this type of amplifier configuration operates quite effectively, inasmuch as the low frequency transistors can be made to withstand high breakdown voltages, as for example, from +90 volts to about +230 volts. However, presently available high frequency transistors are not capable of effectively withstanding a high voltage and therefore can not be used in the construction of high bandwith video amplifiers. High frequency transistors operate at lower collector-emitter voltages and have a lower collector-emitter breakdown voltage. Thus, in a video amplifier it would be desirable to have a high fequency transistor with a high collector-emitter breakdown voltage and this heretofore has been unavailable.

Another characteristic of most transistors is the limitation of the amount of power which can be dissipated by the transistor. At high voltage between the collector and the emitter, the transistor will dissipate more power, which may exceed safe operating conditions. In addition, the highest frequency of a video amplifier depends on the value of the collector resistor ($R_c$) and the load and is given by $$f_H = \frac{1}{2\pi R_c C_{LOAD}}$$

where $C_{LOAD}$ is the capacitance of the load and $f_H$ is the highest frequency of the amplifier.

The load is usually predetermined by the type of transistors and the CRT involved. Therefore, to increase the bandwith of the amplifier the collector resitance must be decreased, which in turn, increases the power that must be dissipated by transistor. In effect, since $P = I^2/R_c$ there is a technical dilemna in that high collector-emitter voltage is needed to properly bias the cathode tube, but the transistor can not properly and efficiently operate at high collector-emitter voltages because of a high power dissipation. To decrease the power dissipation the collector resistor voltage must be increased, which, in turn, degrades performance of the amplifier at high frequencies.

Another problem with color video amplifiers is that each gun of the video display screen is operated by an individual amplifier. Thus, for a three color picture tube including, for example, red, green and blue guns, three individual amplifiers are required. Each amplifier should ideally have the same AC characteristics and the same linearity, although each should have an independent DC bias adjustment of the output signal relative to true ground potential.

In actual operation, each gun of a multi-color video tube has significantly different characteristics in that there has never been any perfected technique for making identical guns. This is clearly apparent from the graph of FIG. 2, which is hereinafter described in more detail. Accordingly, each gun of a picture tube requires a different DC voltage potential in order to operate properly. For example, one gun may operate properly at an 75 volt level and another gun may operate properly at a 110 volt level. Therefore, each amplifier must be biased in a different manner in order to provide the different DC voltages relative to a true ground potential on each of the guns. However, the linearity and frequency characteristics of each amplifier depend on the DC bias of that amplifier. This creates another technical dilema in that to provide the same linearity and AC characteristics all amplifiers require an equal DC bias. However, for proper operation of a multi-gun tube, each amplifier must have a different DC bias. Heretofore, there has not been any effective resolution of this problem.

U.S. Pat. No. 3,281,705 to Frye discloses a wide band signal invertor circuit which uses separate signal paths for high frequency signal portions and low frequency signal portions. This patent discloses a separate potentiometer for controlling a DC voltage level on an output, as well as a source of negative DC bias voltage through a fixed bias resistor, and a DC negative bias voltage through a variable resistor to vary the DC voltage level at an output terminal.

U.S. Pat. No. 3,413,563 to Tongue discloses a transistor amplifier having substantially disipationless feedback paths to achieve a wide band response with substantially uniform gain. U.S. Pat. No. 3,461,393 to Webb, Administrator with respect to George D. Thompson et al, discloses a broad band distribution amplifier having a thermistor in the input stage of the amplifier to receive high frequency RF input signals and which thermistor is variable.

U.S. Pat. No. 3,810,256 to Van Doorn discloses a broad-band transistor amplifier having a conventional negative feedback circuit which utilizes a cascade arrangement of two impedenances and injects distortion products in phase opposition into the output circuit of the amplifier.

OBJECTS OF THE INVENTION

It is, therefore, a primary object of the present invention to provide a high frequency wideband video amplifier circuit which utilizes an output stage capable of using presently available transistors and provides the required DC level of the output stage for proper bias of a CRT.

It is another object of the present invention to provide a high frequency video amplifier circuit of the type stated which also has high tracking linearity and frequency response which is ideally suitable for multi-gun picture tubes.

It is a further object of the present invention to provide a high frequency video amplifier circuit of the type stated in which a first power supply provides a power to the DC part of the amplifier circuit and a second power supply provides a regulated DC bias.

It is an additional object of the present invention to provide a high frequency video amplifier circuit which is highly efficient for operation with multi-gun picture tubes and which enables each amplifier for each of the guns to operate at a different DC bias and yet to maintain the desired linearity and bandwith in all amplifiers.

It is another salient object of the present invention to provide a high frequency video amplifier circuit of the type stated which is highly efficient in its operation and which can be constructed from available components.

It is also an object of the present invention to provide a method of operating a video amplifier by applying a floating DC voltage to the amplifier at the output stage thereof and to also provide an adjustable DC bias voltage thereto.

With the above and other objects in view, my invention resides in the novel features of form, construction, arrangement, and combination of parts presently described and pointed out in the claims.

SUMMARY OF THE DISCLOSURE

A high frequency video amplifier circuit which also has high tracking linearity and which can be used as part of a video monitor, a projector monitor, or other type of monitor where high bandwith and/or high tracking linearity may be required. Therefore, for the purpose of the present invention, all such monitors with which the amplifier circuit may be used or where the amplifier circuit may have a part of are referred to as "video amplifiers".

The amplifier circuit of the present invention includes an AC pre-amplifier which receives a video input signal and this AC pre-amplifier is typically operated by a low voltage power source. The signal from the pre-amplifier is passed through an AC coupling capacitor wherein the DC component in the signal is effectively removed. The signal is thereupon introduced into a summing node which receives a DC bias feedback for restoration of the DC component of a signal in a manner hereinafter described in more detail.

The AC signal with the DC component restored added thereto is thereupon introduced into a DC amplifier. This amplifier is operated by its own power source and also has a floating ground line. The output of the restorer amplifier is introduced into an output stage which may contain one or more high frequency transistors therein, as well as a buffer section. The output stage is operable by a so-called "floating power supply" often referred to herein as a first power supply and which provides a nominal DC voltage, as for example, a 60 volt or 65 volt level across the output stage. The output stage is also provided with a floating ground line which is connected in common with the floating ground line to the DC restorer amplifier.

The present invention also employs an additional DC bias power supply which is connected to the floating ground line in order to add a DC bias signal to the output stage. The DC bias may range from about −200 volts DC to about 200 volts DC and if needed is added to the floating ground level in order to produce the proper bias voltage on the output stage relative to the true ground potential.

As indicated previously, the output signal from the output stage is also re-introduced to a summing node in order to regenerate the DC bias which is needed for proper operation of a CRT.

The amplifier circuit of the present invention is highly effective with color monitors, that is, those monitors employing a plurality of guns for generating a multi-color display. The amplifier operable with each gun can be individually adjusted to provide the proper DC bias. The output stage of each of these amplifiers generally operates in a linear region with limited range. If an output stage of any one amplifier is biased at a different level than the output stage of any other amplifier, there will be a lack of linearity, and there will be bandwith differences. Similar linearity and bandwith are necessary for a high quality and high resolution video displays. By biasing all of the amplifiers at the same level relative to floating ground of each amplifier and by adding the individual bias necessary for each of the amplifiers, the linearity and bandwith is maintained and is independent of DC bias of the output stage relative to true ground potential.

This invention possesses many other advantages and has other purposes which may be made more clearly apparent from a consideration of forms in which it may be embodied. These forms are shown in the drawings accompanying and forming part of the present specification. They will now be described in detail, for the purposes of illustrating the general principles of the invention; but it is to be understood that such detailed descriptions are not to be taken in a limiting sense.

BRIEF DESCRIPTION OF THE DRAWINGS

Figure 1:
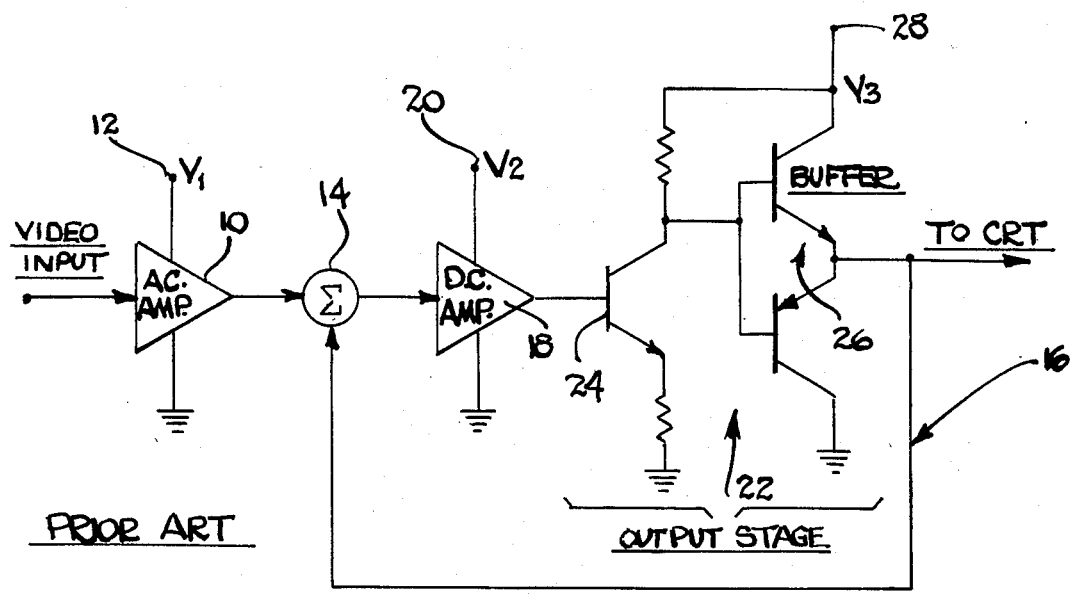
Figure 3:
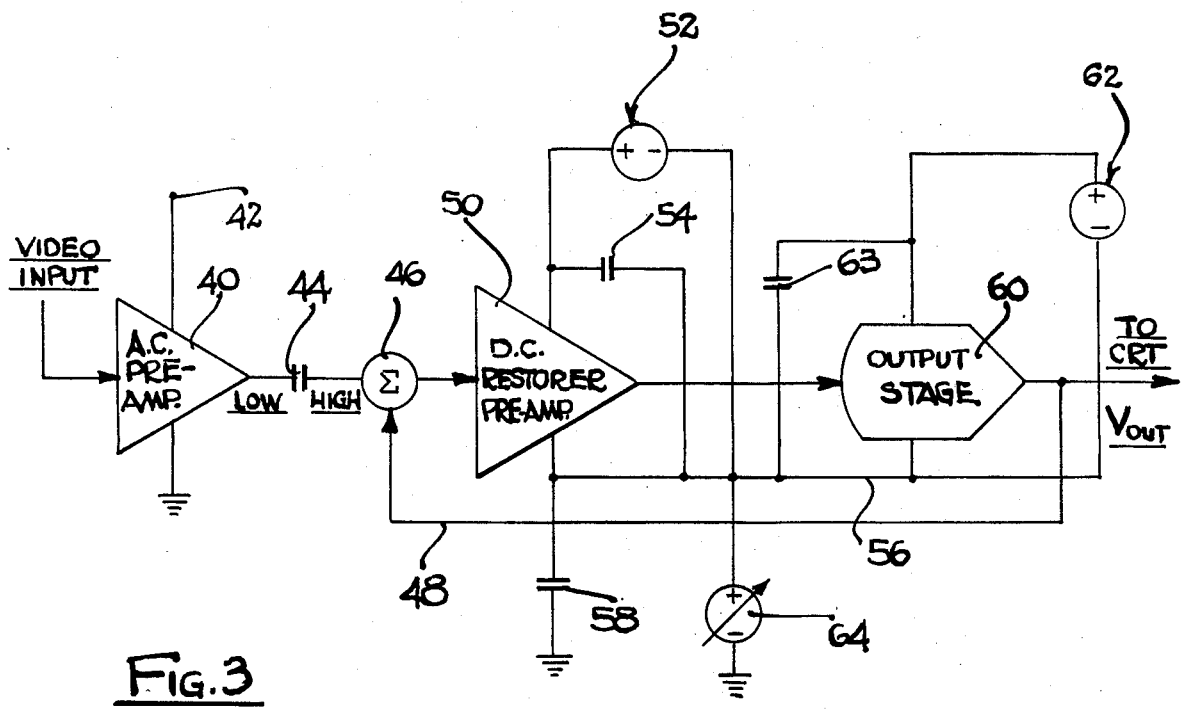
Figure 2:
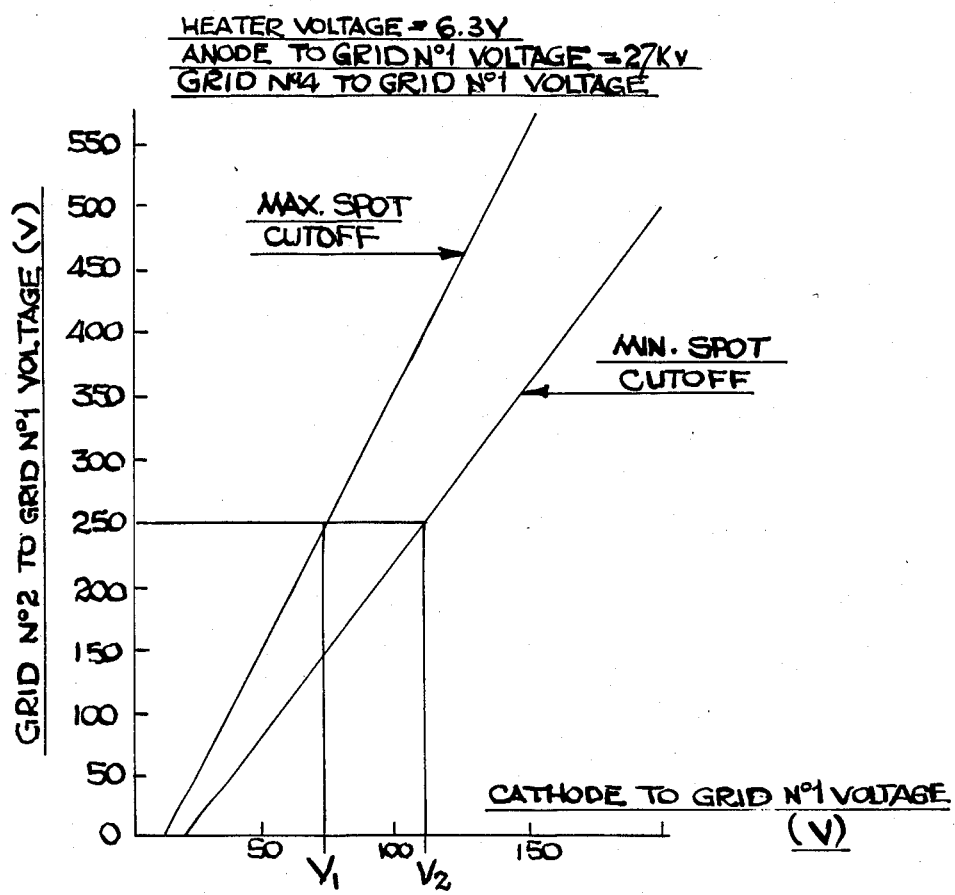
Figure 4:
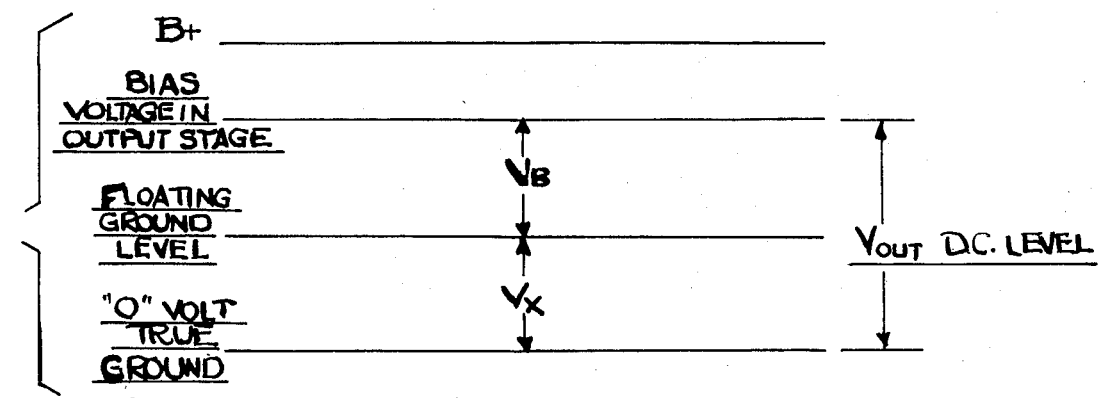
Figure 5:
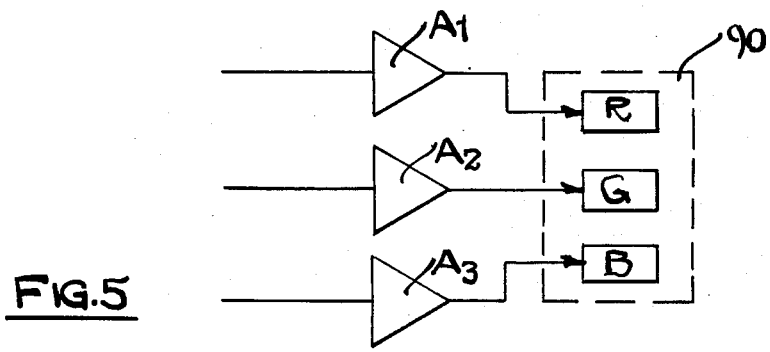

Having thus described the invention in general terms, reference will now be made to the accompanying drawings (two sheets) in which:

FIG. 1 is a schematic circuit illustration of a typical prior art video amplifier;

FIG. 2 is a schematic graph showing the grid to grid voltage as a function of cathode to grid voltage in a conventional cathode ray tube;

FIG. 3 is a schematic circuit illustration of a video amplifier circuit constructed in accordance with and embodying the present invention;

FIG. 4 is a chart showing the addition of the floating voltage to the DC bias voltage in order to obtain an output video signal and with specific DC bias relative to true ground potential; and FIG. 5 is a schematic circuit illustration showing three amplifier circuits of the present invention connected to individual guns of a color video monitor.

DETAILED DESCRIPTION OF A PREFERRED EMBODIMENT

A conventional video amplifier of the type widely found in the prior art is more fully illustrated in FIG. 1 of the drawings, and illustrates those type of prior art amplifiers previously described. For purposes of more fully understanding the princples of the present invention, this prior art video amplifier is described in more detail herein.

The prior art video amplifier, as illustrated in FIG. 1, comprises an AC amplifier or pre-amplifier 10 which receives an input video signal. This AC amplifier 10 is powered by a specified voltage usually from a low voltage power source, schematically designated as $V_1$ and also by reference numeral 12, and this amplifier 10 is also grounded. The output signal of the amplifier 10 generally passes through a capacitive mechanism (not shown), and which may form part of the amplifier circuit 10. As the signal passes through the capacitor, the DC component of the signal is removed.

The amplified signal is then introduced into a summing node 14 which receives a DC bias feedback over a feedback line 16. The alternating current signal with the DC bias thereon is then introduced into a DC amplifier 18 which also is powered from a separate power source, designated as $V_2$, and also by reference numeral 20. Moreover, this DC amplifier is also grounded in the manner as illustrated. The output of the DC amplifier is then introduced into an output stage, designated by reference numeral 22, and which comprises a transistor 24, as well as a buffer stage 26. Moreover, this output stage is powered by another power source designated as $V_3$ and also by reference numeral 28.

The output of the buffer stage 26 is connected to a conventional cathode ray tube monitor and more specifically, the gun of the monitor either the cathode or grid No. 1 which modulates the electron beam providing different intensities on the screen of the monitor. In addition, the feedback line 16 is connected to the output and to the summing node 14 for restoration of the DC bias signal to the video signal at this summing node 14.

This prior art system is designed to restore the DC level of the video signal and amplify the signal as may be required. In addition, this prior art system also provides a DC level in the output signal to accommodate a specific video tube. The prior art video amplifier may also contain additional controls (not shown) for adjusting the amplifier for multi-gun video display tubes.

As indicated previously, there is presently no perfected techique for making identical guns in a multicolor video tube. This fact is clearly apparent by reference to FIG. 2 which discloses a plot of a grid to grid voltage e.g. grid No. 2 to a grid No. 1 voltage as a function of cathode to grid No. 1 voltage in a conventional cathode ray tube. From FIG. 2 it can be seen that if the voltage, between grid No. 2 and grid No. 1 is set at about e.g. 250 Volts then the bias of the cathode ray tube can effectively be between $V_1$ and $V_2$ or anywhere between 75 volts to about 110 volts.

It should be understood that the output stage, as illustrated in this particular embodiment, may adopt a large number of configurations and FIG. 1 illustrates only one specific embodiment. Nevertheless, each of these prior art amplifiers generally operate on essentially the same principal and the prior art video amplifiers suffer from the same disadvantages previously mentioned in that they are not effectively operable as high frequency video amplifiers to provide high resolution.

Most of the available video amplifiers normally operate in the lower frequency ranges somewhere between about 5 to about 80 mergahertz. It would be desirable to provide operation of a video amplifier at 90 mergahertz and higher. Therefore, for the purposes of the present invention, a low frequency range is deemed to be about 5 megahertz to about 60 megahertz and a high frequency range is deemed to be about 90 megahertz to about 300 megahertz.

FIG. 3 represents one preferred form of high frequency video amplifier constructed in accordance with and embodying the present invention. This video amplifier of the present invention includes an AC pre-amplifier 40 which receives a video input signal in the manner as shown. The pre-amplifier 40 is also powered by a low voltage power source designated by reference numeral 42 and is also grounded to a true ground, or 0 volt ground, in the manner as shown. The output of the preamplifier 40 is passed through a capacitor 44 where the DC bias component is removed. The signal on the input side of the capacitor has a lower voltage than on the output side of the capacitor. This signal is thereupon introduced into a summing node 46 which receives a DC bias for restoration to the signal over a feedback line 48, as hereinafter described in more detail.

The output of the summing node 46 is introduced into a DC restorer amplifier 50 which is powered by a separate floating power source 52, in the manner as shown. Moreover, one side of this power source 52 is connected to a so-called "floating ground line" 56, that is, at a ground potential for an AC signal but which is not a zero DC voltage level, but one which is different than a true zero volt level and which may vary. A capacitor 54 is connected to the ground line 56 across the amplifier 50 for bypass purposes. Capacitors 58 and 63 are also provided for by-pass purposes.

The output of the DC restorer amplifier 50 is introduced into an output stage designated by reference numeral 60. This output stage 60 is also powered by a separate power supply such as a power supply 62, in the manner as illustrated, and which is often referred to as a first power supply. This power supply 62 is similarly connected to the floating ground line 56.

The output stage generates the video output signal which is introduced into the gun of a video display tube, such as a cathode ray tube, for display. Moreover, the signal from the output stage 60 is also re-introduced over the feedback line 48 during a specific time interval in order to restore a DC level of the incoming video signal.

The power supply 62 is generally designed to power the output stage. A separate power supply 64 is also provided and is connected to the floating ground line 56, in the manner as illustrated in FIG. 3. The polarity is shown for reference only. In addition, this power supply 64 is variable. The power supply 64 which supplies the DC voltage bias, is generally designed to supply the necessary DC bias level to the output stage relative to true ground potential. In accordance with this arrangement, it is possible to add DC bias to the video amplifier by, in effect, adding a DC bias voltage from the power supply 64 to the floating ground level. In this way, the DC level of the output stage is determined by the sum of the DC levels within the output stage and the adjustable power supply 64.

By reference to FIG. 4, it can be observed that the normal ground, as for example, the true ground of the power supply 64 is at a 0 voltage level. The floating ground voltage, which is provided by other end of the power supply 64, is designated as $V_x$ in FIG. 4. The DC level which is set by the output stage of the amplifier is designated by the reference letters $V_B$ in FIG. 4. It can be observed that the voltage to the CRT is a combined total of the voltage $V_x$ and the voltage $V_B$.

FIG. 5 illustrates three of the high frequency video amplifiers of the present invention designated as $A_1$, $A_2$ and $A_3$ connected to the individual guns designated by reference letters R, G and B for the red gun, green gun, and blue gun, respectively, of a video tube 90. In this way, the video amplifiers of the present invention not only provide high resolution by operating at high frequency, but provide high tracking linearity. Thus, if all of the guns of a color tube are not identical, which is usually the case, each of the individual amplifiers $A_1$, $A_2$ and $A_3$ will operate at different voltages established by the power supply 64. Three power supplies will be required for the three amplifiers. However, each of the individual amplifiers, can operate with its own individual DC bias, as established by the power supply 62 of that individual amplifier. In this way, the voltage relative to the true ground can be changed by merely adjusting the DC level from the power supply 64 on each amplifier. Thus, and in accordance with this arrangement, it is possible to have all of the amplifiers operate linearly and with high efficiency.

Thus, there has been illustrated and described a unique and novel high frequency wideband video amplifier which is capable of providing high resolution and also capable of providing high tracking linearity by operating the output stage through a pair of individual power supplies with one power supply providing a nominal floating voltage and the other providing a DC bias voltage which is additive thereto. For multi-gun systems, each amplifier uses its own power supply. Thus, the present invention fulfills all of the objects and advantages which have been sought. It should be understood that many changes, modifications, variations and other uses and applications will become apparent to those skilled in the art after considering this specification and the accompanying drawings. Therefore, any and all such changes, modifications, variations and other uses and applications which do not depart from the spirit and scope of the invention are deemed to be covered by the invention which is limited only by the following claims.

Having thus described my invention, what I desire to claim and secure by Letters Patent is:

1. A high frequency video amplifier circuit capable of providing an adjustable DC voltage output, said amplifier circuit comprising:
    (a) a DC amplifier receiving a video signal with a DC bias signal restored therein,
    (b) an output section receiving the signal from the DC amplifier,
    (c) a first power supply for supplying a DC voltage to the output section to permit operation of said amplifier circuit such as to provide an output signal of a predetermined voltage level and at a pre-determined DC bias level relative to a floating ground, and
    (d) a second power supply for supplying DC voltage to said output section which is additive to the DC voltage from said first power supply to cause operation of the amplifier circuit at a pre-determined DC voltage level relative to a true ground level.

2. The high frequency video amplifier circuit of claim 1 further characterized in that said DC amplifier is a DC restorer amplifier, and said circuit comprises a node connected to the input of the DC restorer amplifier to receive a bias signal during a pre-determined period of time to thereby add a DC bias signal to the video signal and which video signal is an AC signal received at that node.

3. The high frequency video amplifier circuit of claim 2 further characterized in that the DC bias signal is provided over a feedback circuit line.

4. The high frequency video amplifier circuit of claim 3 further characterized in that the feedback circuit line is connected to the node and to the output section.

5. The high frequency video amplifier circuit of claim 4 further characterized in that an AC amplifier receives the video signal and passes same through a capacitor which removes the DC bias therefrom and which DC bias is restorable therein at said node.

6. The high frequency video amplifier circuit of claim 1 further characterized in that said output section is connected to a floating ground line which is connected to said second power supply to receive the DC bias voltage.

7. The high frequency video amplifier circuit of claim 1 further characterized in that said DC restorer amplifier and said output section are connected to a floating ground line which is connected to said second power supply to receive the DC bias voltage.

8. The high frequency video amplifier circuit of claim 1 further characterized in that the DC voltage from said second power supply is a DC bias signal, and said second power supply is a variable output power supply so that the DC bias signal added to said output section can be varied.

9. The high frequency video amplifier circuit of claim 1 further characterized in that said second power supply is also connected to a 0 volt ground level.

10. An improvement in a high frequency video amplifier circuit of the type comprising a DC amplifier receiving a video signal comprising an AC component with a DC bias signal therein and an output section to provide a video signal with a DC voltage of a selected level, the improvement comprising:
    (a) a first power supply for supplying a DC voltage to the output section to permit operation of said amplifier circuit such as to provide an output signal of a pre-determined voltage level and at a pre-determined DC bias level relative to a floating ground, and
    (b) a second power supply for supplying DC voltage to said output section which is additive to the DC voltage from said first power supply to cause operation of the amplifier circuit at a predetermined DC voltage level relative to a true ground level.

11. The high frequency video amplifier circuit of claim 10 further characterized in that the DC voltage from said second power supply is a bias signal, and said second power supply is a variable power supply so that the DC bias signal added to said output section can be varied.

12. The high frequency video amplifier circuit of claim 11 further characterized in that said second power supply is also connected to a 0 volt ground level.

13. A multi-gun, high resolution video system including a video tube, said video system comprising:
(a) a plurality of electron guns associated with said tube with each applying a video signal containing component to a screeen of said tube,
(b) a separate DC amplifier connected to each said gun for operating same with each separate amplifier having an output section,
(c) a separate first power supply for each amplifier, connected across each output section of each said amplifier for applying a DC voltage to permit operation of said amplifiers such as to provide an output signal of a pre-determined voltage level and at a pre-determined DC bias level relative to a floating ground, and
(d) a separate second power supply for each amplifier and connected to said output section of each said amplifier for supplying a DC voltage to said output section which is additive to said first power supply DC voltage to cause operation of the amplifier circuit at a pre-determined DC voltage level relative to a true ground level and which can be different for each of the individual amplifiers.

14. The multi-gun high resolution video system of claim 13 further characterized in that each said amplifier comprises:
(a) a DC amplifier component receiving a video signal with a DC bias signal therein,
(b) an output section receiving the signal from the associated DC amplifier, and
(c) a node connected to an input of the DC amplifier to receive a bias signal during a pre-determined period of time for adding a DC bias signal to the video signal and which video signal is an AC signal received at that node.

15. The multi-gun high resolution video system of claim 14 further characterized in that a feedback line from the output of the output section of an amplifier is connected to the node of that amplifier to provide the feedback DC bias signal.

16. The multi-gun high resolution video system of claim 14 further characterized in that each amplifier comrises an input AC amplifier component.

17. The multi-gun high resolution video system circuit of claim 14 further characterized in that said output section is connected to a floating ground line which is connected to each said second power supply to receive the DC bias voltage.

18. The multi-gun high resolution video system of claim 14 further characterized in that said DC amplifier and said output section are connected to a floating ground line which is connected to said second power supply to receive the DC bias voltage.

19. The multi-gun high resolution video system of claim 14 further characterized in that each said second power supply is a variable power supply so that the DC bias signal added to said output section can be varied.

20. The multi-gun high resolution video system of claim 19 further characterized in that each said second power supply is also connected to a 0 volt ground level.

21. A method of operating a video amplifier at high frequency which comprises:
(a) restoring a DC bias signal into an AC video signal from which a bias signal has been removed,
(b) DC amplifying the AC video signal with the DC bias restored therein,
(c) introducing the DC amplified signal into an output section of a video amplifier and applying a first DC voltage to the output section to cause operation and the generation of a video signal of pre-determined amplitude having a pre-determined DC voltage level relative to a floating ground potential, and
(d) applying a second DC voltage to the video signal, and adding the same to the first DC voltage to provide an output signal of combined first and second DC voltages relative to a true ground potential.

22. The method of claim 21 further characterized in that the second DC voltage is a bias voltage and the method comprises varying the second DC bias voltage so that the DC bias voltage is added in such manner that the total output signal can be of a pre-determined DC voltage level relative to a true ground potential.

* * * * *